(12) United States Patent
Yang et al.

(10) Patent No.: US 8,836,005 B2
(45) Date of Patent: Sep. 16, 2014

(54) MEMORY ARRAY

(75) Inventors: I-Chen Yang, Hsinchu (TW); Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 212 days.

(21) Appl. No.: 12/862,020

(22) Filed: Aug. 24, 2010

(65) Prior Publication Data

US 2010/0314680 A1    Dec. 16, 2010

Related U.S. Application Data

(63) Continuation-in-part of application No. 12/263,091, filed on Oct. 31, 2008, now Pat. No. 7,799,638.

(51) Int. Cl.
| | |
|---|---|
| H01L 27/108 | (2006.01) |
| H01L 27/115 | (2006.01) |
| H01L 21/768 | (2006.01) |
| H01L 29/423 | (2006.01) |
| H01L 21/28 | (2006.01) |

(52) U.S. Cl.
CPC .... *H01L 21/28282* (2013.01); *H01L 27/11568* (2013.01); *H01L 21/76885* (2013.01); *H01L 29/4234* (2013.01)
USPC .......................... 257/314; 257/231; 257/E29.3

(58) Field of Classification Search
USPC .......... 257/314–17, 321, 326, E29.129, E29.3
See application file for complete search history.

(56) References Cited

U.S. PATENT DOCUMENTS

| | | | |
|---|---|---|---|
| 6,939,767 B2* | 9/2005 | Hoefler et al. ................ | 438/267 |
| 2006/0249779 A1* | 11/2006 | Choi et al. ..................... | 257/315 |
| 2008/0173921 A1* | 7/2008 | Li et al. ......................... | 257/311 |

* cited by examiner

*Primary Examiner* — Thanhha Pham
(74) *Attorney, Agent, or Firm* — J.C. Patents

(57) ABSTRACT

A memory array includes a charge storage structure and a plurality of conductive materials over the charge storage structure is provided. Each conductive material, serving as a word line, has a substantially arc-sidewall and a substantially straight sidewall.

31 Claims, 4 Drawing Sheets

MEMORY ARRAY

CROSS-REFERENCE TO RELATED APPLICATION

This application is a continuation-in-part application of and claims the priority benefit of U.S. patent application Ser. No. 12/263,091, filed on Oct. 31, 2008, now allowed. The entirety of the above-mentioned patent application is hereby incorporated by reference herein and made a part of specification.

BACKGROUND OF THE INVENTION

1. Field of Invention

The present invention relates to a semiconductor device. More particularly, the present invention relates to a memory array.

2. Description of Related Art

Electrically programmable and erasable non-volatile memory technologies known as EEPROM and flash memory based on charge storage are used in a variety of modern applications. A number of memory cell structures are used for EEPROM and flash memory. As the dimensions of integrated circuits shrink, greater interest is arising in memory cell structures based on charge storage dielectric layers, because of the scalability and simplicity of the manufacturing processes. Memory cell structures based on charge storage dielectric layers include structures known by the industry names NROM, SONOS, MONOS, TANOS or PHINES, for example. These memory cell structures store data by storage charge in a charge storage dielectric layer, such as silicon nitride.

Conventionally, after the charge storage dielectric layer is formed over the substrate, the word lines are formed by forming a conductive layer over the substrate and then patterning the conductive layer into the word lines. By using the method for forming the word lines mentioned above, it is difficult to further scale down the size of each of the word lines since the size of the word line is limiter by the resolution of the optical tool used in the photolithography process. Therefore, the size of a memory unit is limited by the capability of the photolithography process.

SUMMARY OF THE INVENTION

Accordingly, the present invention is to provide a memory array having word lines with sizes smaller than the minimum size limited by the photolithography technology.

The invention provides a memory array including a charge storage structure and a plurality of conductive materials over the charge storage structure. Each conductive material, serving as a word line, has a substantially arc-sidewall and a straight sidewall.

According to an exemplary embodiment of the present invention, each conductive material is a strip.

According to an exemplary embodiment of the present invention, each conductive material has a top width and a bottom width, and the top width is smaller than that the bottom width.

According to an exemplary embodiment of the present invention, the top width is smaller than that the bottom width at least 40%.

According to an exemplary embodiment of the present invention, the top width of each conductive material is about 60 to about 300 angstroms, and the bottom width of each conductive material is about 150 to about 500 angstroms.

According to an exemplary embodiment of the present invention, a height of each conductive material is about 450 angstroms to about 3000 angstroms.

According to an exemplary embodiment of the present invention, the pitch of the conductive material is about 500 to about 1000 angstroms.

According to an exemplary embodiment of the present invention, the plurality of conductive materials consists of a plurality of pair of conductive materials.

According to an exemplary embodiment of the present invention, two conductive materials in each pair of conductive materials are substantially symmetric.

According to an exemplary embodiment of the present invention, a first straight sidewall of a first conductive material is opposite to a second straight sidewall of a second conductive material.

According to an exemplary embodiment of the present invention, a first arc-sidewall of a first conductive material is opposite to a second arc-sidewall of a second conductive material.

According to an exemplary embodiment of the present invention, the charge storage structure comprises a bottom material layer, a charge storage layer and an upper material layer.

According to an exemplary embodiment of the present invention, the bottom material layer comprises a single-layered material layer made of low-k (low-dielectric constant) material.

According to an exemplary embodiment of the present invention, the bottom material layer comprises a single-layered material layer made of high-k (high-dielectric constant) material.

According to an exemplary embodiment of the present invention, the bottom material layer comprises a multi-layered material layer.

According to an exemplary embodiment of the present invention, the multi-layered material layer is selected from a group consisting of a low-k/high-k layer and a low-k/high-k/low-k layer.

According to an exemplary embodiment of the present invention, the material of the charge storage layer comprises silicon nitride or silicon-rich nitride.

According to an exemplary embodiment of the present invention, the upper material layer comprises a single-layered material layer made of low-k (low-dielectric constant) material or high-k (high-dielectric constant) material.

According to an exemplary embodiment of the present invention, the upper material layer comprises a multi-layered material layer.

According to an exemplary embodiment of the present invention, the multi-layered material layer is selected from a group consisting of a low-k/high-k layer and a low-k/high-k/low-k layer and any combination of low k and high k layer.

According to an exemplary embodiment of the present invention, the material of the conductive materials is selected from a group consisting of polysilicon, doped polysilicon, tungsten, aluminum, titanium, titanium nitride, tantalum nitride, copper, iridium oxide, platinum, nickel and the combination thereof.

A memory array including a charge storage structure on a substrate and a plurality of word lines on the charge storage structure is provided. The width of the word lines is smaller than 500 angstroms and an aspect ration of each word lines is about 2.5 to 5.

According to an exemplary embodiment of the present invention, the height of each of the word lines is about 400 to about 2500 angstroms.

According to an exemplary embodiment of the present invention, the pitch of the conductive material is about 500 to about 1000 angstroms.

According to an exemplary embodiment of the present invention, the charge storage structure comprises, from a bottom to a top of the charge storage structure, a bottom material layer, a charge storage layer and an upper material layer.

According to an exemplary embodiment of the present invention, the bottom material layer comprises a single-layered material layer made of low-k (low-dielectric constant) material.

According to an exemplary embodiment of the present invention, the bottom material layer comprises a single-layered material layer made of high-k (high-dielectric constant) material.

According to an exemplary embodiment of the present invention, the bottom material layer comprises a multi-layered material layer.

According to an exemplary embodiment of the present invention, the multi-layered material layer can be selected from a group consisting of a low-k/high-k layer and a low-k/high-k/low-k layer.

According to an exemplary embodiment of the present invention, the material of the charge storage layer comprises silicon nitride or silicon-rich nitride.

According to an exemplary embodiment of the present invention, the upper material layer comprises a single-layered material layer made of low-k (low-dielectric constant) material or high-k (high-dielectric constant) material.

According to an exemplary embodiment of the present invention, the upper material layer comprises a multi-layered material layer.

According to an exemplary embodiment of the present invention, the multi-layered material layer can be selected from a group consisting of a low-k/high-k layer and a low-k/high-k/low-k layer and any combination of low k and high k layer.

According to an exemplary embodiment of the present invention, the material of the word lines is selected from a group consisting of polysilicon, doped polysilicon, tungsten, aluminum, titanium, titanium nitride, tantalum nitride, copper, iridium oxide, platinum, nickel and the combination thereof.

According to an exemplary embodiment of the present invention, the word lines are parallel to each other.

In the present invention, the conductive materials in the later formed memory array are functioned as word lines. Since the conductive materials are formed as materials on the sidewalls of the patterned material layer, the width of each of the word lines can be well controlled and can be further scaled down to the size smaller than the minimum size limited by the photolithography process. Thus, the memory unit with the conductive materials as the word lines is smaller than the conventional memory unit. Further, by controlling the thickness of the patterned material layer and the thickness of the conductive material layer, the width of each of the word lines can be easily controlled.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
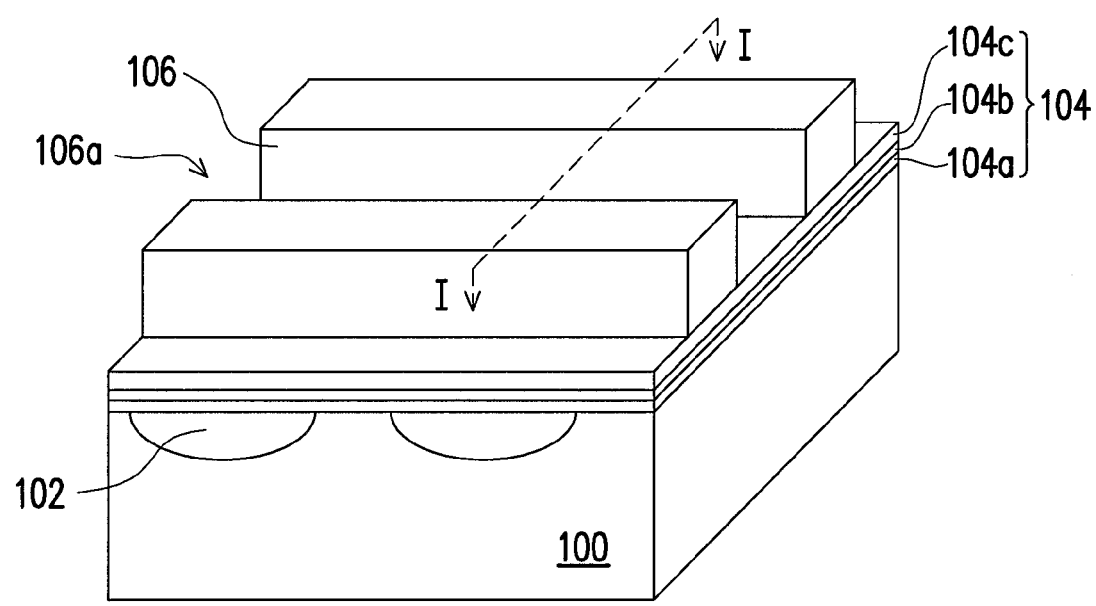
FIG. 1 is a three-dimension diagram schematically showing a substrate for forming a memory array thereon according to one embodiment of the invention.
Figure 2A:
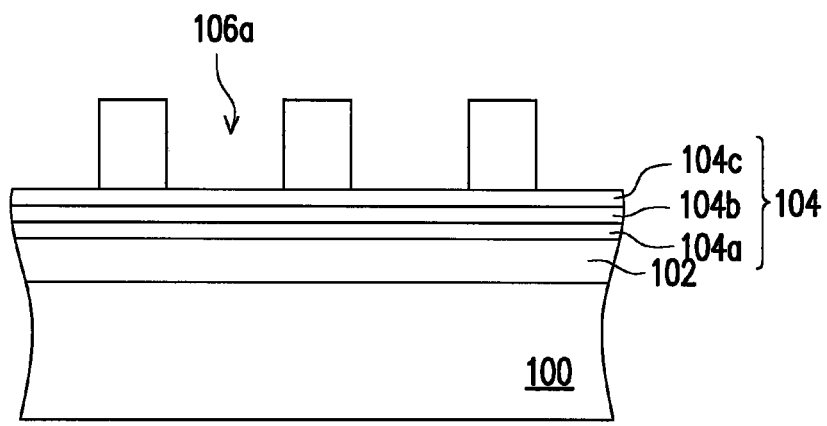
FIGS. 2A through 2E are cross-sectional views along the line I-I in FIG. 1 for showing a method for forming a memory array according to one embodiment of the present invention.

FIG. 1 is a three-dimension diagram schematically showing a substrate for forming a memory array thereon according to one embodiment of the invention. FIGS. 2A through 2E are cross-sectional views along the line I-I in FIG. 1 for showing a method for forming a memory array according to one embodiment of the present invention. FIG. 2F is a cross-sectional view showing a memory array according to another embodiment of the present invention. As shown in FIG. 1 and FIG. 2A, a substrate 100 having several buried bit line regions 102 formed therein is provided. The substrate 100 can be, for example but not limited to, a silicon substrate or a silicon-on-insulator substrate. Furthermore, the conductive type of each of the buried bit line regions 102 can be, for example but not limited to, N type or P type. Then, as shown in FIG. 1 and FIG. 2A, a charge storage structure 104 is formed over the substrate 100. It should be noticed that, the charge storage structure comprises, from the bottom to the top of the charge storage structure, a bottom material layer 104a, a charge storage layer 104b and an upper material layer 104c. The bottom material layer 104a can be, for example but not limited to, a single-layered material layer made of low-k (low-dielectric constant) material. The low-k material can be, for example but not limited to, silicon oxide. Also, the bottom material layer 104a can be, for example but not limited to, a single-layered material layer made of high-k (high-dielectric constant) material. The high-k material can be, for example but not limited to, hafnium aluminum oxide (HfAlO). In one exemplary embodiment, the bottom material layer 104a, can be for example but not limited to, a multi-layered material layer. The multi-layered material layer can be selected from a group consisting of a low-k/high-k layer and a low-k/high-k/low-k layer and any combination of low k and high k layer. Furthermore, low-k/high-k layer can be, for example but not limited to, the silicon oxide/HfSiO layer, the silicon oxide/HfO$_2$ layer or the oxide/nitride layer. Moreover, the low-k/high-k/low-k layer can be, for example but not limited to, the silicon oxide/silicon nitride/silicon oxide layer or silicon oxide/aluminum oxide/silicon oxide layer. In addition, the material of the charge storage layer 104b can be a single-layered material layer or a multi-layered material layer. The material of the charge storage layer 104b includes an insulator. The insulator can be, for example but not limited to, silicon nitride or silicon-rich nitride. Further, the upper material layer 104c can be, for example but not limited to, a single-layered material layer made of low-k material, high-k material, silicon oxide, HfAlO, aluminum oxide or the combination thereof. Also, in another exemplary embodiment, the upper material layer 104c can be, for example but not limited to, a multi-layered material layer such as the silicon nitride/silicon oxide or silicon oxide/silicon nitride/silicon oxide.

Furthermore, in the other exemplary embodiment, the multi-layered material layer can be selected from a group consisting of a low-k/high-k layer and a low-k/high-k/low-k layer and any combination thereof.

Thereafter, as shown in FIG. 1 and FIG. 2A, a patterned material layer 106 is formed over the substrate 100. The patterned material layer 106 having a plurality of trenches 106a expose a portion of the charge storage structure 104. The patterned material layer 106 can be, for example but not limited to, made of silicon nitride, silicon oxide, silicon oxy-nitride or the combination thereof. Besides, the thickness of the patterned material layer 106 is about 500 to about 3200 angstroms. In one embodiment, the patterned material layer 106 is constructed by a plurality of strip-type patterns 106b. That is, the strip-type patterns 106b are formed on the charge storage structure 104 and are the parallel to each other. Moreover, the strip-type patterns 106b are separated from each other by a plurality of gaps 106a (also known as trenches 106a mentioned above) respectively. In addition, a distance between the strip-type patterns 106b is larger than a width of each of the strip-type patterns 106b.

Figure 2B:
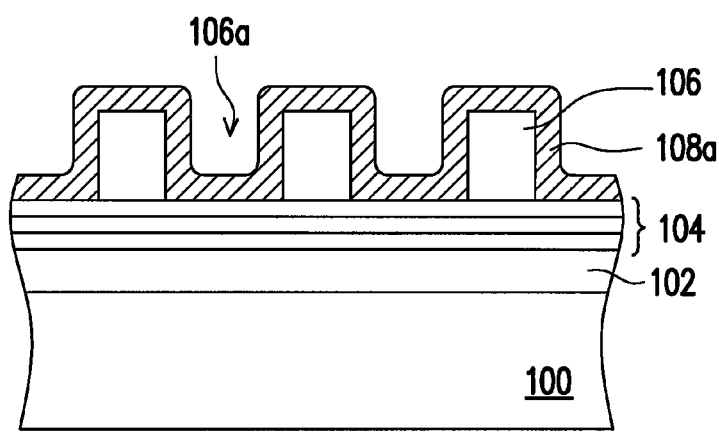

Then, as shown in FIG. 2B, a conductive material layer 108 is formed over the substrate 100. The conductive material layer 108 is conformal to the trenches 106a. The material of the conductive material layer 108 can be, for example but not limited to, selected from a group consisting of polysilicon, doped polysilicon, tungsten, aluminum, titanium, titanium nitride, tantalum nitride, copper, iridium oxide, platinum, nickel and the combination thereof.

Figure 2C:
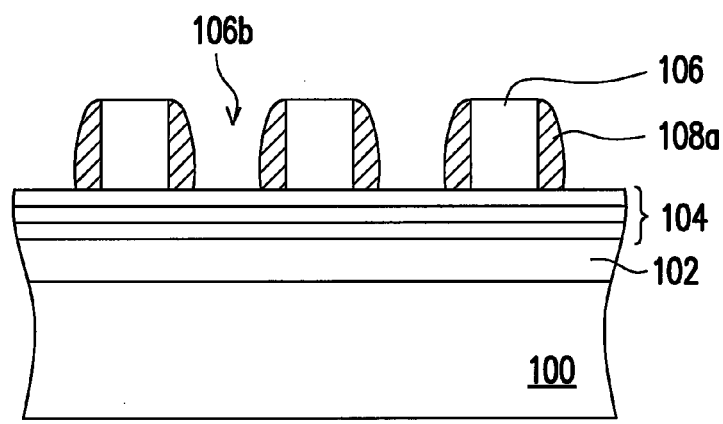

Then, as shown in FIG. 2C, a portion of the conductive material layer 108 is removed by anisotropic etching process, for example, until a top surface of the patterned material layer 106 and a portion of the charge storage structure 104 at the bottom of the trenches 106a are exposed. Therefore, the conductive material layer 108 is transformed into a plurality of conductive materials 108a, with spacer form, for example, located on the sidewalls of the trenches 106a of the patterned material layer 106 respectively and a portion of the charge storage structure 104 at the bottom of the trenches 106a is exposed by the conductive materials 108a. In an embodiment, each conductive material 108a is a strip with a substantially arc-sidewall and a straight sidewall when the portion of the conductive material layer 108 is removed by an anisotropic etching process.

It should be noticed that the width of each of the conductive materials 108a is smaller than 500 angstroms. Also, the pitch of the conductive material 108a is about 500 to 1000 angstroms. Furthermore, the conductive materials 108a are parallel to each other and across the buried bit lines 102 within the substrate 100.

Figure 2D:
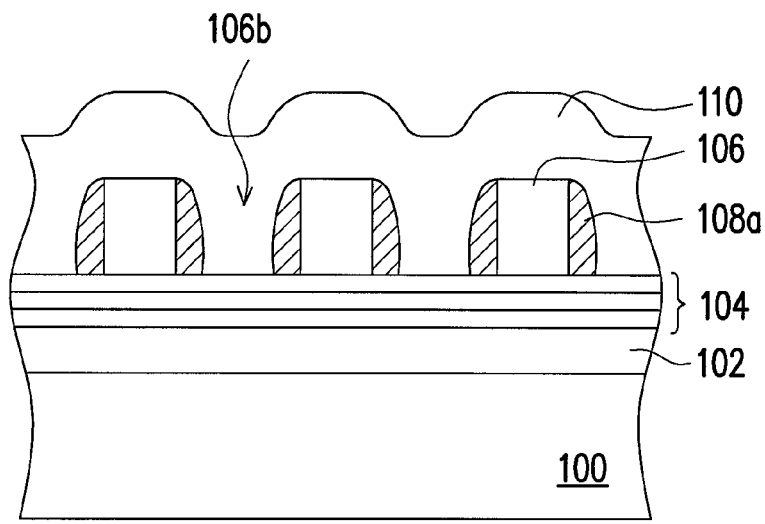

Then, as shown in FIG. 2D, an insulating layer 110 is formed over the substrate 100 to fill up the trenches 106a of the patterned material layer 106. The insulating layer 110 can be, for example but not limited to, silicon oxide, silicon nitride or silicon oxy-nitride.

Figure 2E:
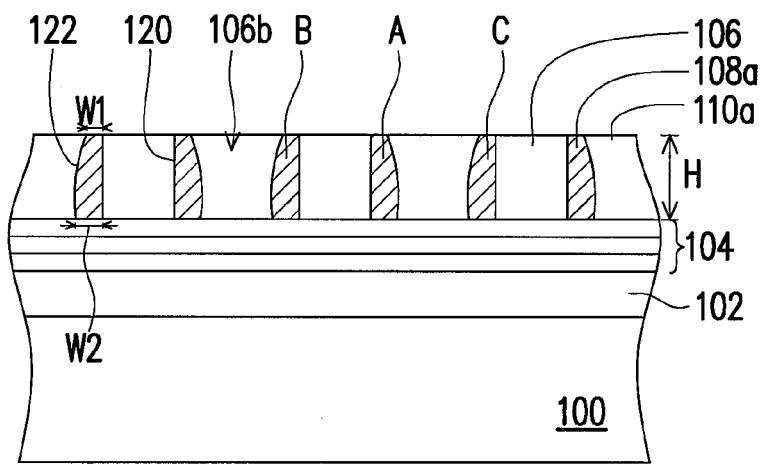
Figure 2F:
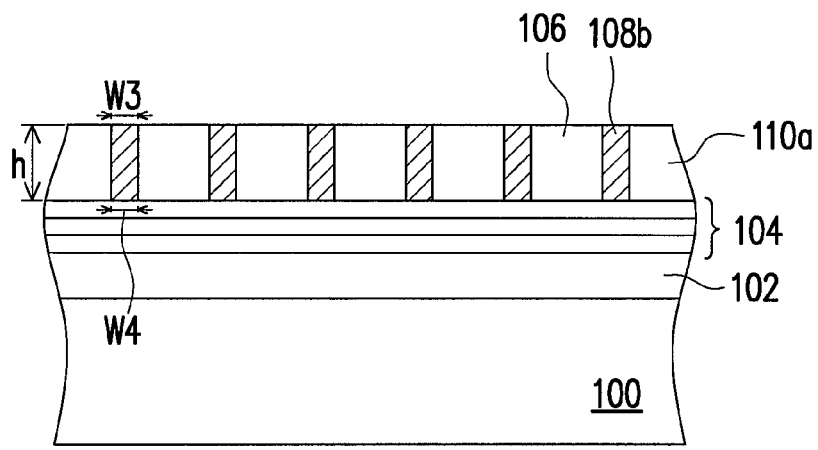
FIG. 2F is a cross-sectional view showing a memory array according to another embodiment of the present invention.

Moreover, as shown in FIGS. 2E and 2F, a planarization process is performed to remove at least a portion of the insulating layer 110 so that the top surfaces of the conductive materials 108a, patterned material layer 106 and the remaining insulating layer 110a are substantially flat. The planarization process can be, for example but not limited to, Chemical Polishing process or etching back process.

Figure 3:
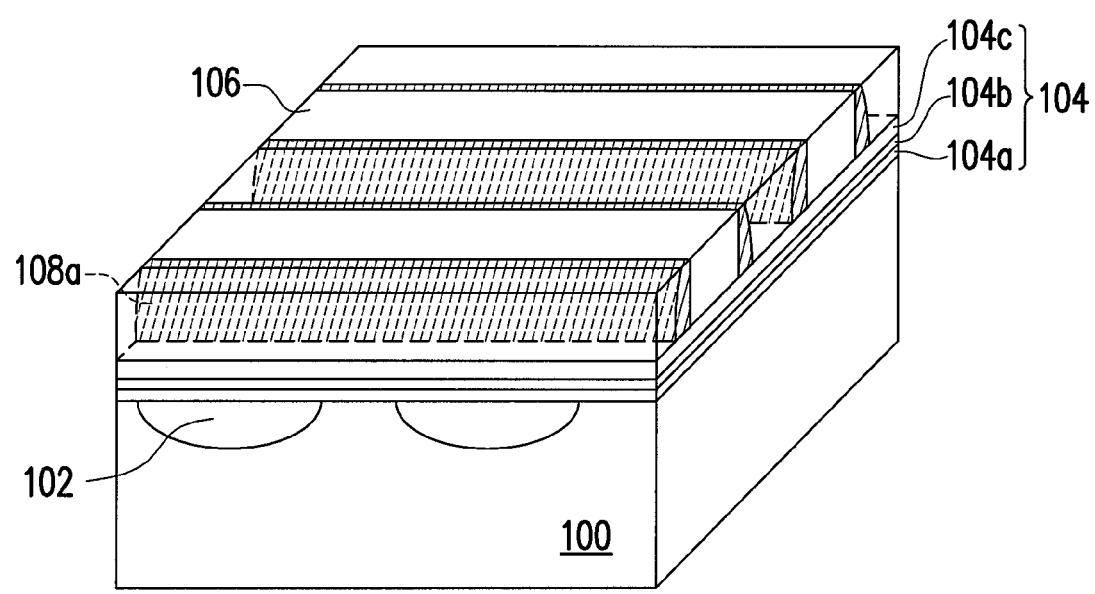
FIG. 3 is a three-dimension diagram schematically showing the memory array shown in FIG. 2E.

In an embodiment, as shown in FIGS. 2E and 3, the planarization process is performed to remove a portion of the insulating layer 110 until a top surface of the patterned material layer 106 and a top surface of each of the conductive materials 108a are exposed so that the contour of conductive materials 108a is substantially remained. That is, each remained conductive material 108a is a strip with a substantially arc-sidewall 122 and a substantially straight sidewall 120. The substantially straight sidewall 120 of one conductive material 108a (A) is opposite to the substantially straight sidewall of the other conductive material 108a (B). The substantially arc-sidewall 122 of one conductive material 108a (A) is opposite to the substantially arc-sidewall 122 of other conductive materials 108a (C). This structure can be named as straight-to-straight and arc-to-arc form. Further, each conductive material 108a has a top width W1 smaller than a bottom width W2. For example, the top width W1 of the remained conductive material 108a is smaller than the bottom width W2 of the remained conductive material 108a at least 40%. In an exemplary embodiment, the top width W1 of the remained conductive material 108a is about 60 angstroms to about 300 angstroms, and the bottom width W2 of the remained conductive material 108a is about 150 to about 500 angstroms as well as the height H of remained conductive material 108a is about 450 angstroms to about 3000 angstroms. In another exemplary embodiment, the top width W1 of the remained conductive material 108a is about 60 angstroms to about 300 angstroms, and the bottom width W2 of the remained conductive material 108a is about 150 to about 500 angstroms as well as the height H of remained conductive material 108a is about 450 angstroms to about 2500 angstroms. Besides, in an exemplary embodiment, an aspect ratio (H/W2) of the remained conductive material 108a is about 3 to about 6. By this way, in other words, a plurality of pair of conductive material 108a is formed. Two conductive material 108a in each pair are substantially symmetric. The substantially straight sidewall 120 of one conductive material 108a (A) is opposite to the substantially straight sidewall 120 of the other conductive material 108a (B) in the same pair. The substantially arc-sidewall 122 of one conductive material 108a (A) is opposite to the substantially arc-sidewall 122 of the other conductive material 108a (C) in an adjacent pair.

In another embodiment, as shown in FIG. 2F, the planarization process is performed to remove not only a portion of the insulating layer 110 but also a portion of the patterned material layer 106 and a portion of each of the conductive materials 108a so that each remained conductive material 108b has two substantially straight sidewalls. That is the remained conductive materials 108b are substantially parallel to each other. Each remained conductive material 108b is a strip with a top width W3 being substantially the same as or substantially close to a bottom width W4. In an exemplary embodiment, the widths W3 and W4 of the remained conductive material 108b is about 150 angstroms to about 500 angstroms and the height h of remained conductive material 108a is about 400 angstroms to about 2500 angstroms. In another exemplary embodiment, the widths W3 and W4 of the remained conductive material 108b is about 150 angstroms to about 500 angstroms and the height h of remained conductive material 108b is about 400 angstroms to about 2000 angstroms. Besides, in an exemplary embodiment, an aspect ratio (h/W3 or h/W4) of the remained conductive material 108b is larger than 2, and is about 2.5 to about 5, for example.

In the present invention, the above conductive materials 18a and 18b in the later formed memory array are functioned as word lines. Since the conductive materials are formed as materials on the sidewalls of the patterned material layer, the width of each of the word lines can be well controlled and can be further scaled down to the size smaller than the minimum size limited by the photolithography process. By controlling the thickness of the patterned material layer and the thickness of the conductive material layer, the width of each of the word lines can be easily controlled. Comparing with the conventional method for shrinking the size of the word lines by directly defining the conductive layer, the method of the present invention can provide smaller size of word lines. Thus, the memory unit with the conductive materials as the word lines is smaller than the conventional memory unit.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A memory array, comprising:
a charge storage structure on a substrate; and
a plurality of conductive materials serving as a plurality of word lines over the charge storage structure, wherein each of the conductive materials consists of a substantially arc-sidewall, a substantially straight sidewall, and a bottom connecting the substantially arc-sidewall and the substantially straight sidewall, wherein the neighboring conductive materials with the substantially arc-sidewall only has an insulating structure therebetween, and the insulating structure directly contacts to the whole substantially arc-sidewalls,
the bottom is contacted with the charge storage structure, and neither the whole substantially arc-sidewall nor the whole substantially straight sidewall is contacted with the charge storage structure.

2. The memory array of claim 1, wherein each of the conductive materials is a strip.

3. The memory array of claim 1, wherein each of the conductive materials has a top width and a bottom width, and the top width is smaller than that the bottom width.

4. The memory array of claim 3, wherein the top width is smaller than the bottom width at least 40%.

5. The memory array of claim 3, wherein the top width of each of the conductive materials is about 60 to about 300 angstroms, and the bottom width of each of the conductive materials is about 150 to about 500 angstroms.

6. The memory array of claim 3, wherein a height of each of the conductive materials is about 450 angstroms to about 3000 angstroms.

7. The memory array of claim 1, wherein a pitch of the conductive materials is about 500 to about 1000 angstroms.

8. The memory array of claim 1, wherein the plurality of conductive materials consists of a plurality of pair of conductive materials.

9. The memory array of claim 8, wherein two conductive materials in each pair of the conductive materials are substantially symmetric.

10. The memory array of claim 1, wherein a first straight sidewall of a first conductive material of the conductive materials is opposite to a second substantially straight sidewall of a second conductive material of the conductive materials.

11. The memory array of claim 1, wherein a first arc-sidewall of a first conductive material of the conductive materials is opposite to a second arc-sidewall of a second conductive material of the conductive materials.

12. The memory array of claim 1, wherein the charge storage structure comprises a bottom material layer, a charge storage layer and an upper material layer.

13. The memory array of claim 12, wherein the bottom material layer comprises a single-layered material layer made of low-k (low-dielectric constant) material.

14. The memory array of claim 13, wherein the bottom material layer comprises a single-layered material layer made of high-k (high-dielectric constant) material.

15. The memory array of claim 13, wherein the bottom material layer comprises a multi-layered material layer.

16. The memory array of claim 15, wherein the multi-layered material layer is selected from a group consisting of a low-k/high-k layer and a low-k/high-k/low-k layer.

17. The memory array of claim 12, wherein a material of the charge storage layer comprises silicon nitride or silicon-rich nitride.

18. The memory array of claim 12, wherein the upper material layer comprises a single-layered material layer made of low-k (low-dielectric constant) material or high-k (high-dielectric constant) material.

19. The memory array of claim 12, wherein the upper material layer comprises a multi-layered material layer.

20. The memory array of claim 19, wherein the multi-layered material layer is selected from a group consisting of a low-k/high-k layer and a low-k/high-k/low-k layer and any combination of low k and high k layer.

21. The memory array of claim 1, wherein a material of the conductive material is selected from a group consisting of polysilicon, doped polysilicon, tungsten, aluminum, titanium, titanium nitride, tantalum nitride, copper, iridium oxide, platinum, nickel and the combination thereof.

22. A memory array, comprising:
a charge storage structure on a substrate; and
a plurality of word lines on the charge storage structure, wherein each of the word lines consists of a substantially arc-sidewall, a substantially straight sidewall, and a bottom connecting the substantially arc-sidewall and the substantially straight sidewall,
the neighboring word lines with the substantially arc-sidewall only has an insulating structure therebetween, and the insulating structure directly contacts to the whole substantially arc-sidewalls, wherein
the width of the word lines is smaller than 500 angstroms and an aspect ratio of each word lines is about 2.5 to about 5, the bottom is contacted with the charge storage structure, and none of the whole substantially arc-sidewall and the whole substantially straight sidewall is contacted with the charge storage structure.

23. The memory array of claim 22, wherein a height of each of the word lines is about 400 angstroms to about 2500 angstroms.

24. The memory array of claim 22, wherein a pitch of the word lines is about 500 to about 1000 angstroms.

25. The memory array of claim 22, wherein the charge storage structure comprises, from a bottom to a top of the charge storage structure, a bottom material layer, a charge storage layer and an upper material layer.

26. The memory array of claim 1, wherein the charge storage structure is a continuous structure disposed on the substrate entirely.

27. The memory array of claim 1, further comprises a plurality of buried bit line regions in the substrate, wherein the plurality of buried bit line regions is under the bottom of each of the conductive materials.

28. The memory array of claim 22, wherein the charge storage structure is a continuous structure disposed on the substrate entirely.

29. The memory array of claim 22, further comprises a plurality of buried bit line regions in the substrate, wherein the plurality of buried bit line regions is under the bottom of each of the word lines.

30. A memory array, comprising:
a charge storage structure on a substrate;
a plurality of conductive materials serving as a plurality of word lines over the charge storage structure, wherein each of the conductive materials consists of a substantially arc-sidewall, a substantially straight sidewall, and a bottom connecting the substantially arc-sidewall and the substantially straight sidewall, wherein a trench is formed between the neighboring substantially straight sidewalls;
an insulating structure, formed only between the neighboring substantially arc-sidewalls of the neighboring conductive materials, and the insulating structure directly contacts to the whole substantially arc-sidewalls; and
a patterned nonconductive material layer, filled in the trench between the neighboring substantially straight sidewalls.

31. The memory array of claim 30, wherein the patterned nonconductive material layer is made of silicon nitride, silicon oxide, silicon oxy-nitride or a combination thereof.

* * * * *